United States Patent
Itoh

(10) Patent No.: US 9,679,925 B2
(45) Date of Patent: Jun. 13, 2017

(54) ACTIVE MATRIX SUBSTRATE, DISPLAY DEVICE, DEFECT MODIFICATION METHOD FOR DISPLAY DEVICE, AND METHOD FOR MANUFACTURING DISPLAY DEVICE

(71) Applicant: Sharp Kabushiki Kaisha, Osaka-shi, Osaka (JP)

(72) Inventor: Ryohki Itoh, Osaka (JP)

(73) Assignee: Sharper Kabushiki Kaisha, Sakai (JP)

( * ) Notice: Subject to any disclaimer, the term of this patent is extended or adjusted under 35 U.S.C. 154(b) by 211 days.

(21) Appl. No.: 14/759,714

(22) PCT Filed: Dec. 24, 2013

(86) PCT No.: PCT/JP2013/084471
§ 371 (c)(1),
(2) Date: Jul. 8, 2015

(87) PCT Pub. No.: WO2014/109221
PCT Pub. Date: Jul. 17, 2014

(65) Prior Publication Data
US 2015/0357355 A1    Dec. 10, 2015

(30) Foreign Application Priority Data
Jan. 10, 2013  (JP) .................................. 2013-002949

(51) Int. Cl.
*G02F 1/1333* (2006.01)
*H01L 27/12* (2006.01)
*G02F 1/1362* (2006.01)

(52) U.S. Cl.
CPC .... *H01L 27/1244* (2013.01); *G02F 1/136259* (2013.01); *H01L 27/1222* (2013.01);
(Continued)

(58) Field of Classification Search
None
See application file for complete search history.

(56) References Cited

U.S. PATENT DOCUMENTS 6,111,621 A * 8/2000 Kim ..................... G02F 1/1309
349/192
2005/0195338 A1  9/2005  Matsumoto et al.
(Continued)

FOREIGN PATENT DOCUMENTS

JP   10-170946 A   6/1998
JP   2001-166704 A   6/2001
(Continued)

OTHER PUBLICATIONS

Official Communication issued in International Patent Application No. PCT/JP2013/084471, mailed on Mar. 18, 2014.

*Primary Examiner* — Richard Kim
(74) *Attorney, Agent, or Firm* — Keating & Bennett, LLP

(57) ABSTRACT

An active matrix substrate (10) includes a first line (101), a second line (102), a third line (103), a fourth line (104) and a fifth line (105) provided in a non-display region F. The first line crosses a non-input-side end portion of at least one bus line of a first bus line group with an insulating layer interposed therebetween. The second line crosses a non-input-side end portion of at least one bus line of a second bus line group with an insulating layer interposed therebetween. The third line crosses an input-side end portion of the first bus line group with an insulating layer interposed therebetween, and does not cross the second bus line group. The fourth line crosses an input-side end portion of the second bus line group with an insulating layer interposed therebetween, and does not cross the first bus line group. The fifth line is routed so as to cross the first, second, third and fourth lines with an insulating layer interposed therebetween. The (Continued)

third line and the fourth line are electrically separated from each other.

17 Claims, 12 Drawing Sheets

(52) U.S. Cl.
CPC ...... *H01L 27/1225* (2013.01); *H01L 27/1259* (2013.01); *G02F 2001/136263* (2013.01)

(56) References Cited

U.S. PATENT DOCUMENTS

| | | | |
|---|---|---|---|
| 2009/0284679 | A1 | 11/2009 | Kim et al. |
| 2011/0122105 | A1 | 5/2011 | Itoh et al. |
| 2011/0141071 | A1 | 6/2011 | Ozeki et al. |
| 2012/0138922 | A1 | 6/2012 | Yamazaki et al. |
| 2012/0169986 | A1* | 7/2012 | Kwon ................. G02F 1/13452 349/139 |

FOREIGN PATENT DOCUMENTS

| | | |
|---|---|---|
| JP | 2003-043521 A | 2/2003 |
| JP | 2003-344874 A | 12/2003 |
| JP | 2005-249993 A | 9/2005 |
| JP | 2008-165237 A | 7/2008 |
| JP | 2012-134475 A | 7/2012 |
| WO | 2010/021075 A1 | 2/2010 |
| WO | 2010/041361 A1 | 4/2010 |

\* cited by examiner

ACTIVE MATRIX SUBSTRATE, DISPLAY DEVICE, DEFECT MODIFICATION METHOD FOR DISPLAY DEVICE, AND METHOD FOR MANUFACTURING DISPLAY DEVICE

TECHNICAL FIELD

The present invention relates to an active matrix substrate. The present invention also relates to a display device, a method for repairing a defect of a display device, and a method for manufacturing a display device.

BACKGROUND ART

Liquid crystal display devices, which have small thicknesses and low power consumptions, have been used widely in various fields. Particularly, active matrix-type liquid crystal display devices including a thin film transistor (TFT) for each pixel, which have high specifications with high contrast ratios and desirable response characteristics, have been used in TVs, monitors, laptop computers, and the like, and have recently extended their market size.

An active matrix-type liquid crystal display device includes an active matrix substrate having a plurality of TFTs formed thereon, and a color filter substrate provided so as to oppose the active matrix substrate, wherein the orientation of the liquid crystal layer sandwiched therebetween is controlled to produce a display.

In addition to the TFTs, the active matrix substrate includes a large number of gate bus lines for supplying scanning signals to the TFTs, and a large number of source bus lines for supplying display signals to the TFTs. An active matrix substrate is produced by repeating a step of depositing a semiconductor film, an insulating layer and a conductive film on an insulative substrate, and a step of patterning these films. Therefore, a wire break may occur along a bus line (the gate bus line or the source bus line described above). Signals are no longer properly supplied to TFTs of pixels located downstream of the wire break location, and those pixels can no longer produce an intended display.

Thus, a wire break along a bus line can lead to a display defect. In view of this, techniques have been proposed in the art to repair a display defect arising from a wire break along a bus line by using repair lines provided in the bezel region (non-display region).

For example, Patent Document No. 1 discloses a display device including a first, second and third repair line provided in the non-display region. In this display device, the plurality of source bus lines (drain bus lines) are grouped into m groups. For each group of source bus lines, there are n first repair lines, and each of the n first repair lines crosses all the source bus lines of the corresponding group with an insulating layer interposed therebetween. On the opposite side from the first repair lines with respect to the display region, there are n second repair lines for each group of source bus lines. Each of the n second repair lines also crosses all the source bus lines of the corresponding group with an insulating layer interposed therebetween. There are 2×n third repair lines provided so as to cross all (i.e., m×n) second repair lines with an insulating layer interposed therebetween. One end of the first repair line and the other end thereof are electrically connected to the corresponding third repair line. The opposite ends of the second repair line cross the third repair line.

If a wire break occurs along a source bus line in the display device of Patent Document No. 1, the intersection between the broken source bus line and the first repair line is irradiated with laser light to make an electrical connection therebetween, and the intersection between the broken source bus line and the second repair line is irradiated with laser light to make an electrical connection therebetween. Moreover, the intersection between the second repair line, connected to the broken source bus line, and the third repair line is also irradiated with laser light to make an electrical connection therebetween. Thus, a portion of the broken source bus line that is upstream of the wire break location and a portion thereof that is downstream of the wire break location are electrically connected to each other via the first, second and third repair lines. This allows for a display signal to be supplied across the entirety of the broken source bus line.

CITATION LIST

Patent Literature

[Patent Document No. 1] Japanese Laid-Open Patent Publication No. 2001-166704

SUMMARY OF INVENTION

Technical Problem

However, if a display defect is repaired by using repair lines as described above, a delay (blunting) of a display signal may occur due to the capacitance (load) dangling from the repair lines. The delay of a display signal may lead to a display defect. With a TN mode liquid crystal display device producing a normally white display, for example, if such a delay of a display signal occurs, a thin bright line will be observed as a linear display defect. With the technique of Patent Document No. 1, the first repair line and the second repair line are cut off by way of laser light irradiation in the vicinity of the location of connection with the source bus line. Where bus lines are arranged with a small pitch (i.e., where the display panel is a high-definition panel, and there are a larger number of bus lines), however, it is not possible to ensure a sufficient cut-off area, and conducting the cut-off operation nevertheless might cause a secondary failure.

The present invention has been made in view of problems as set forth above, and an object thereof is to provide an active matrix substrate having a structure suitable for repairing a display defect arising from a wire break along a bus line, and a display device having such an active matrix substrate.

Solution to Problem

An active matrix substrate according to an embodiment of the present invention is an active matrix substrate for use in a display device having a display region, and a non-display region provided outside the display region, the active matrix substrate including: a plurality of bus lines each extending in a predetermined direction, wherein the plurality of bus lines are grouped into a plurality of bus line groups including a first bus line group, and a second bus line group adjacent to the first bus line group; at least one first line provided in the non-display region, the at least one first line each crossing an opposite-side end portion, opposite from a signal-input-side end portion, of at least one bus line of the first bus line group with an insulating layer interposed therebetween; at least one second line provided in the non-display region, the at least one second line each crossing an opposite-side end portion, opposite from a signal-input-side end portion, of at least one bus line of the second bus line group with an insulating layer interposed therebetween; a third line provided in the non-display region, the third line crossing the signal-input-side end portion of the first bus line group with an insulating layer interposed therebetween, and not crossing the second bus line group, a fourth line provided in the non-display region, the fourth line crossing the signal-input-side end portion of the second bus line group with an insulating layer interposed therebetween, and not crossing the first bus line group; and a fifth line provided in the non-display region, the fifth line routed so as to cross the first, second, third and fourth lines with an insulating layer interposed therebetween, wherein the third line and the fourth line are electrically separated from each other, one end portion of the third line that is closer to the fourth line crosses the fifth line, and one end portion of the fourth line that is closer to the third line crosses the fifth line.

In one embodiment, the at least one first line is a plurality of first lines; and the at least one second line is a plurality of second lines.

In one embodiment, the at least one first line is one first line; and the at least one second line is one second line.

In one embodiment, the plurality of bus line groups further include a third bus line group, and a fourth bus line group adjacent to the third bus line group; the active matrix substrate further includes: at least one sixth line provided in the non-display region, the at least one sixth line each crossing an opposite-side end portion, opposite from a signal-input-side end portion, of at least one bus line of the third bus line group with an insulating layer interposed therebetween; at least one seventh line provided in the non-display region, the at least one seventh line each crossing an opposite-side end portion, opposite from a signal-input-side end portion, of at least one bus line of the fourth bus line group with an insulating layer interposed therebetween; an eighth line provided in the non-display region, the eighth line crossing the signal-input-side end portion of the third bus line group with an insulating layer interposed therebetween, and not crossing the fourth bus line group; a ninth line provided in the non-display region, the ninth line crossing the signal-input-side end portion of the fourth bus line group with an insulating layer interposed therebetween, and not crossing the third bus line group; and a tenth line provided in the non-display region, the tenth line routed so as to cross the sixth, seventh, eighth and ninth lines with an insulating layer interposed therebetween; the eighth line and the ninth line are electrically separated from each other, an end portion of the eighth line that is closer to the ninth line crosses the tenth line, and an end portion of the ninth line that is closer to the eighth line crosses the tenth line; and the fifth line and the tenth line are electrically separated from each other.

A display device according to an embodiment of the present invention includes an active matrix substrate having such a configuration as set forth above.

In one embodiment, wherein the plurality of bus lines are a plurality of source bus lines to which a display signal is supplied.

In one embodiment, the active matrix substrate further includes a plurality of gate bus lines each extending in a direction crossing the predetermined direction; and the non-display region includes a first area where signal-input-side end portions of the plurality of source bus lines are located, a second area where opposite-side end portions, opposite from a signal-input side, of the plurality of source bus lines are located, a third area where signal-input-side end portions of the plurality of gate bus lines are located, and a fourth area where opposite-side end portions, opposite from a signal-input side, of the plurality of gate bus lines are located.

In one embodiment, the fifth line is produced from the same conductive film as the plurality of gate bus lines.

In one embodiment, the fifth line is produced from the same conductive film as the plurality of source bus lines.

In one embodiment, a display device having such a configuration as set forth above further includes a first flexible printed circuit attached to an end portion of the active matrix substrate in the first area of the non-display region.

In one embodiment, the fifth line includes a portion formed on the first flexible printed circuit.

In one embodiment, a display device having such a configuration as set forth above further includes a second flexible printed circuit attached to an end portion of the active matrix substrate in the third area of the non-display region.

In one embodiment, the fifth line is routed so as not to run in the third area of the non-display region.

In one embodiment, a display device having such a configuration as set forth above further includes a gate driver that supplies a scanning signal to the plurality of gate bus lines, wherein: the gate driver is provided integral on the active matrix substrate in the third area of the non-display region; and the fifth line is routed so as to run outside the gate driver in the third area of the non-display region.

A method for repairing a defect of a display device according to an embodiment of the present invention is a method for repairing a defect of a display device for use with a display device having such a configuration as set forth above, the method including the steps of: identifying one or more of the bus lines of the first bus line group and the second bus line group that has a wire break; and forming a wiring path that includes one of the first line and the second line, one of the third line and the fourth line, and the fifth line, and that electrically connects between a signal-input-side end portion and an opposite-side end portion, opposite from a signal-input side, of the identified bus line.

In one embodiment, the step of forming the wiring path includes the step of: electrically connecting the identified bus line with the first line, the third line and the fifth line if the identified bus line is a bus line of the first bus line group; and electrically connecting the identified bus line with the second line, the fourth line and the fifth line if the identified bus line is a bus line of the second bus line group.

A method for manufacturing a display device according to an embodiment of the present invention includes the steps of: producing a display device having the active matrix substrate; and repairing a display defect of the display device by using the method for repairing a defect of a display device as set forth above.

Advantageous Effects of Invention

Embodiments of the present invention provide an active matrix substrate having a structure suitable for repairing a display defect arising from a wire break along a bus line, and a display device having such an active matrix substrate.

DESCRIPTION OF EMBODIMENTS

Embodiments of the present invention will now be described with reference to the drawings. Note that the present invention is not limited to the embodiments below.

Embodiment 1

Figure 1:
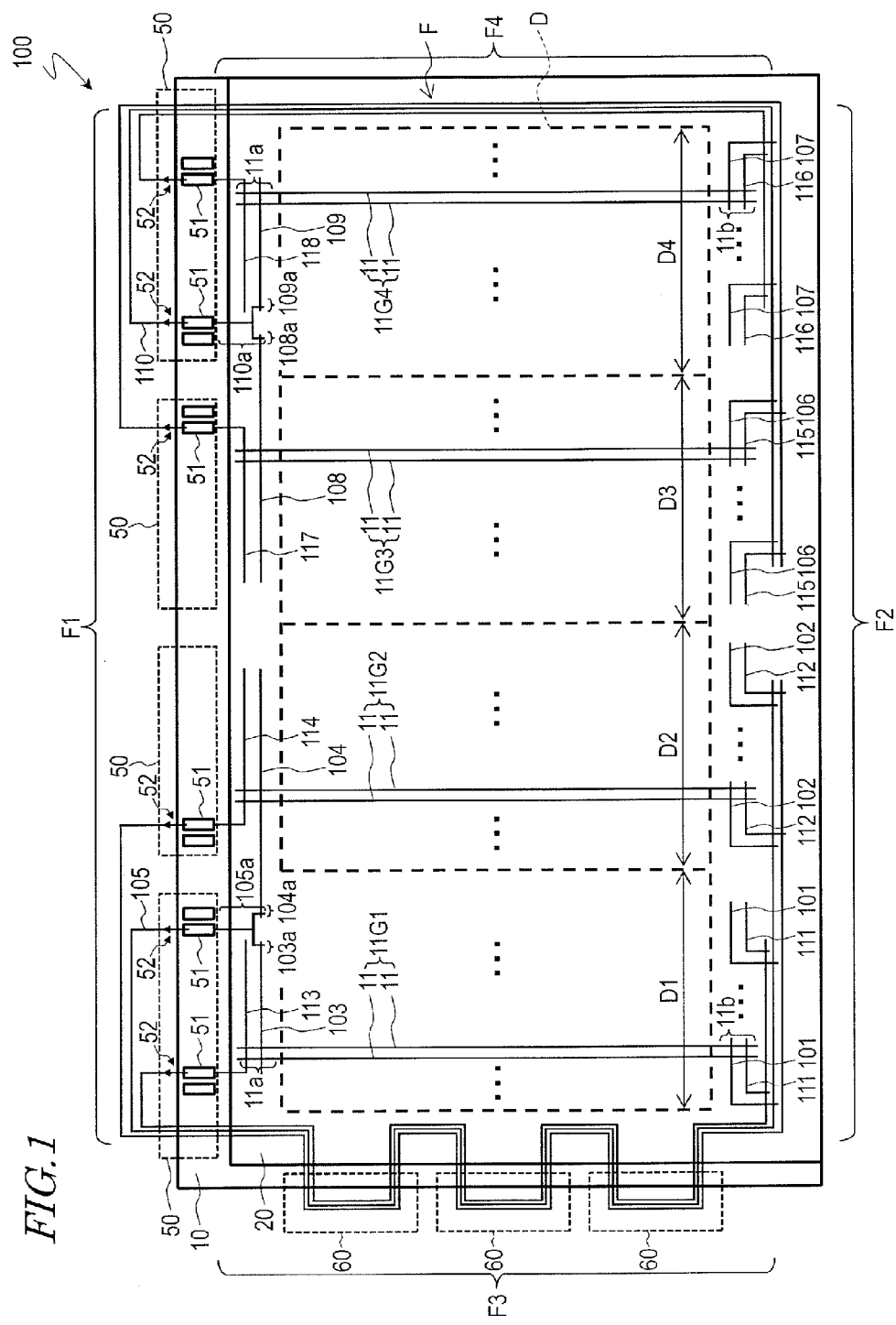
FIG. 1 A plan view schematically showing a liquid crystal display device 100 according to an embodiment of the present invention.
Figure 2:
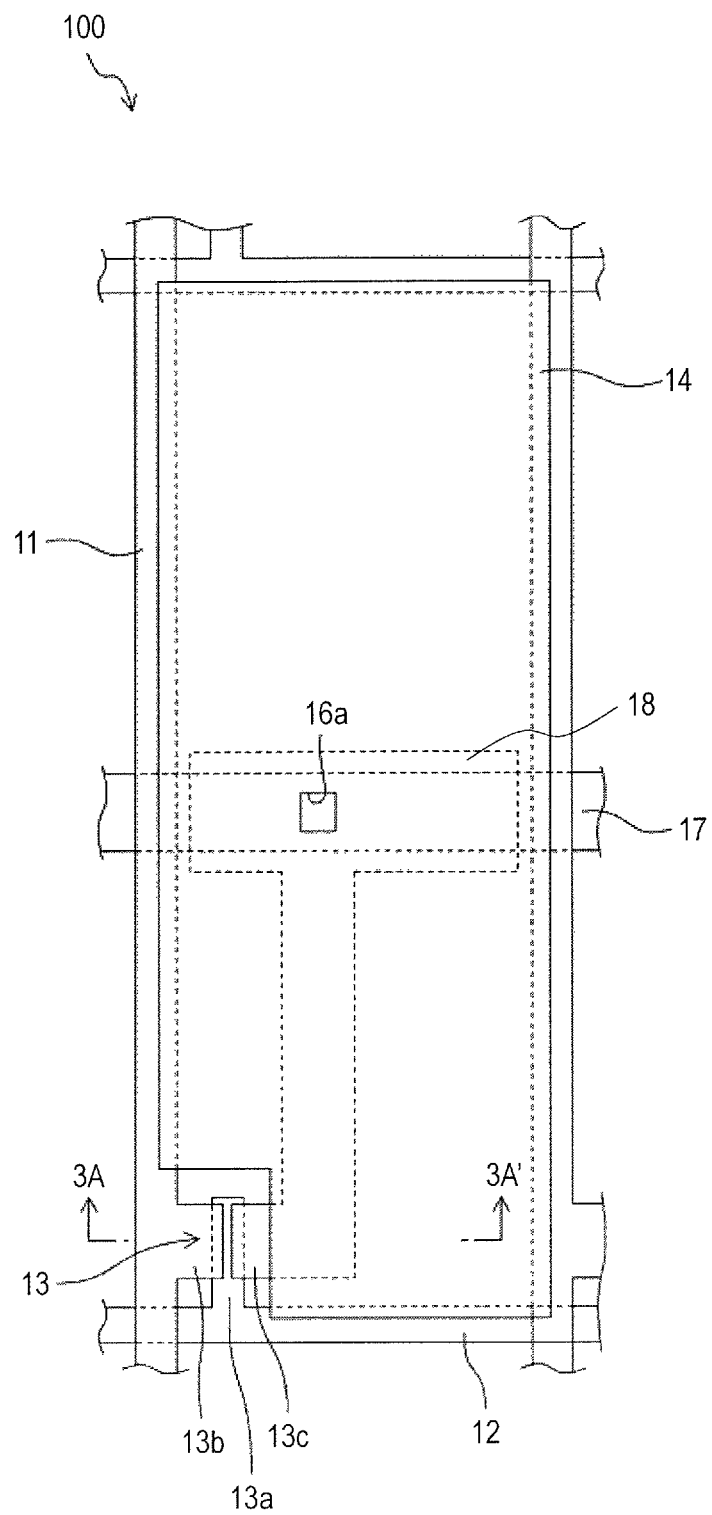
FIG. 2 A plan view schematically showing an area of the liquid crystal display device 100 corresponding to one pixel according to an embodiment of the present invention.
Figure 3:
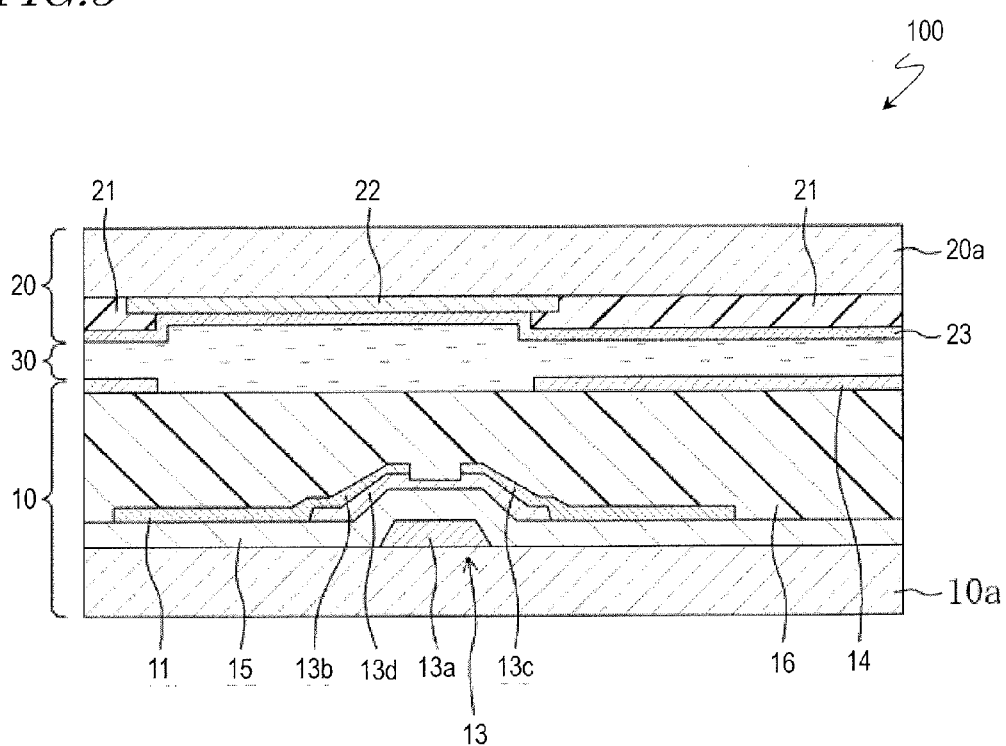
FIG. 3 A cross-sectional view schematically showing an area of the liquid crystal display device 100 corresponding to one pixel according to an embodiment of the present invention, taken along line 3A-3A' of FIG. 2.

FIGS. 1, 2 and 3 show a liquid crystal display device 100 of the present embodiment. FIG. 1 is a plan view schematically showing the liquid crystal display device 100. FIG. 2 is a plan view schematically showing an area of the liquid crystal display device 100 corresponding to one pixel. FIG. 3 is a cross-sectional view taken along line 3A-3A' of FIG. 2.

The liquid crystal display device 100 includes a display region D and a non-display region F, as shown in FIG. 1. The display region D is defined by a plurality of pixels arranged in a matrix pattern. The display region D is divided into a first, second, third and fourth block D1, D2, D3 and D4. The non-display region F is provided outside (around) the display region. The non-display region F is a bezel-shaped region including a first, second, third and fourth area F1, F2, F3 and F4, and is referred to also as the "bezel region".

The liquid crystal display device 100 includes an active matrix substrate (hereinafter referred to as a "TFT substrate") 10, a counter substrate (referred to also as a "color filter substrate") 20 provided so as to oppose the TFT substrate 10, and a liquid crystal layer 30 provided between the TFT substrate 10 and the counter substrate 20, as shown in FIG. 3.

The TFT substrate 10 includes a plurality of source bus lines (signal lines) 11 to which display signals are supplied, a plurality of gate bus lines (scanning lines) 12 to which scanning signals are supplied, a thin film transistor (TFT) 13 provided in each pixel, and a pixel electrode 14 electrically connected to the TFT 13.

Each of the plurality of source bus lines 11 extends in a predetermined direction (the up-down direction in FIGS. 1 and 3). Each of the plurality of gate bus lines 12 extends in the direction (the left-right direction in FIGS. 1 and 3) crossing (perpendicular to) the direction in which the source bus lines 11 extend. A signal-input-side end portion (hereinafter referred to as an "input-side end portion") 11a of the source bus line 11 is located in the first area F1 of the non-display region F. In contrast, an end portion on the opposite side from the signal-input side (hereinafter referred to as a "non-input-side end portion") 11b of the source bus line 11 is located in the second area F2 of the non-display region F. A signal-input-side end portion (hereinafter referred to as an "input-side end portion") of the gate bus line 12 is located in the third area F3 of the non-display region F, and an end portion on the opposite side from the signal-input side (hereinafter referred to as a "non-input-side end portion") of the gate bus line 12 is located in the fourth area F4 of the non-display region F.

The TFT 13 includes a gate electrode 13a, a gate insulating film 15, a source electrode 13b, a drain electrode 13c, and a semiconductor layer 13d.

The gate electrode 13a is electrically connected to a corresponding one of the plurality of gate bus lines 12. The gate insulating film 15 is formed so as to cover the gate electrode 13a.

The source electrode 13b is electrically connected a corresponding one of the plurality of source bus lines 11. The drain electrode 13c is electrically connected the pixel electrode 14. The semiconductor layer 13d is provided so as to be positioned over the gate electrode 13a with the gate insulating film 15 interposed therebetween. The semiconductor layer 13d may be, for example, an amorphous silicon layer or an oxide semiconductor layer (it is understood that the semiconductor layer is not limited thereto). The material of the oxide semiconductor layer may be, for example, an In—Ga—Zn—O-based semiconductor (hereinafter abbreviated as "IGZO-based semiconductor"). Now, an IGZO-based semiconductor is a ternary oxide of In (indium), Ga (gallium) and Zn (zinc), where there is no particular limitation on the ratio (composition ratio) between In, Ga and Zn, and includes In:Ga:Zn=2:2:1, In:Ga:Zn=1:1:1, In:Ga:Zn=1:1:2, and the like, for example. An IGZO-based semiconductor may be amorphous or crystalline. An amorphous IGZO-based semiconductor is advantageous in that it can be produced at a low temperature and that a high mobility can be realized. A preferred crystalline IGZO-based semiconductor is one in which the c axis is oriented generally perpendicular to the layer plane. A crystalline structure of such an IGZO-based semiconductor is disclosed in Japanese Laid-Open Patent Publication No. 2012-134475, for example. The entire disclosure of Japanese Laid-Open Patent Publication No. 2012-134475 is hereby incorporated by reference.

An interlayer insulating film 16 is provided so as to cover the TFT 13, and the pixel electrode 14 is provided on the interlayer insulating film 16. The interlayer insulating film 16 has a contact hole 16a therein for electrically connecting the pixel electrode 14 to the drain electrode 13c of the TFT 13. The pixel electrode 14 is typically formed by a transparent conductive material (e.g., ITO).

The TFT substrate 10 of the present embodiment includes a plurality of Cs bus lines (storage capacitor lines) 17 extending parallel to the gate bus lines 12. A storage capacitor counter voltage (Cs voltage) is supplied to the Cs bus line 17. A storage capacitor is formed, including a storage capacitor electrode 18, which is an extension from the drain electrode 13c of the TFT 13, a portion of the Cs bus line 17 that overlaps with the storage capacitor electrode 18, and the interlayer insulating film 16 located therebetween.

Elements of the TFT substrate 10 (the source bus lines 11, the gate bus lines 12, the TFTs 13, and the like, described above) are supported on an insulating substrate (e.g., a glass substrate) 10a. An alignment film (not shown) is provided on one side of the TFT substrate 10 that is closer to the liquid crystal layer 30.

The counter substrate 20 includes a color filter 21, a black matrix 22, and a counter electrode (common electrode) 23. The counter electrode 23 is formed by a transparent conductive material (e.g., ITO).

Elements of the counter substrate 20 (the color filter 21, and the like, described above) are supported on a transparent insulating substrate (e.g., a glass substrate) 20a. An alignment film (not shown) is provided on one side of the counter substrate 20 that is closer to the liquid crystal layer 30.

The liquid crystal layer 30 may be a horizontal alignment liquid crystal layer of which the alignment is controlled by a horizontal alignment film, or a vertical alignment liquid crystal layer of which the alignment is controlled by a vertical alignment film. There is no particular limitation on the display mode of the liquid crystal display device 100, and a liquid crystal layer 30 of a horizontal alignment-type or a vertical alignment-type is provided depending on the display mode to be used. The display mode may be any of various display modes known in the art. For example, a TN (Twisted Nematic) mode, an MVA (Multi-domain Vertical Alignment) mode, a CPA (Continuous Pinwheel Alignment) mode, an IPS (In-Plane Switching) mode, and an FFS (Fringe Field Switching) mode may be used. Note that where a transverse electric field mode such as an IPS mode or an FFS mode is used, a common electrode is provided on the TFT substrate side.

The liquid crystal display device 100 further includes a plurality of first flexible printed circuits (hereinafter referred to as "first FPCs") 50 attached to an end portion of the TFT substrate 10 in the first area F1 of the non-display region F, and a plurality of second flexible printed circuits (hereinafter referred to as "second FPCs") 60 attached to an end portion of the TFT substrate 10 in the third area F3 of the non-display region F. The liquid crystal display device 100 includes at least one source-side printed wiring board (source-side PWB (not shown)) connected to the first FPCs 50, and at least one gate-side printed wiring board (gate-side PWB (not shown)) connected to the second FPCs 60.

The first FPC 50 includes a source driver (not shown) thereon for supplying a display signal to the source bus line 11. The input-side end portion 11a of the source bus line 11 is electrically connected to the source driver.

The second FPC 60 includes a gate driver (not shown) thereon for supplying a scanning signal to the gate bus line 12. The input-side end portion of the gate bus line 12 is electrically connected to the gate driver.

In the present embodiment, the plurality of source bus lines 11 are grouped into a plurality of bus line groups. More specifically, the plurality of source bus lines 11 are grouped into a first bus line group 11G1, a second bus line group 11G2, a third bus line group 11G3, and a fourth bus line group 11G4. The first bus line group 11G1 is located in the first block D1 of the display region D, and the second bus line group 11G2 is located in the second block D2 of the display region D. The third bus line group 11G3 is located in the third block D3 of the display region D, and the fourth bus line group 11G4 is located in the fourth block D4 of the display region D. Thus, the first bus line group 11G1, the second bus line group 11G2, the third bus line group 11G3 and the fourth bus line group 11G4 are arranged in this order from right to left. That is, the first bus line group 11G1 and the second bus line group 11G2 are adjacent to each other, and the third bus line group 11G3 and the fourth bus line group 11G4 are adjacent to each other.

The liquid crystal display device 100 of the present embodiment includes, in the non-display region F, a wiring structure with which it is possible to repair a display defect arising from a wire break which has occurred along the source bus line 11. The wiring structure will now be described in detail.

First, a defect repairing wiring structure corresponding to the first block D1 and the second block D2 of the display region D will be described.

A plurality of first lines (hereinafter referred to as "first repair lines") 101 and a plurality of second lines (hereinafter referred to as "second repair lines") 102 are provided in the non-display region F of the liquid crystal display device 100, as shown in FIG. 1. A third line (hereinafter referred to as a "third repair line") 103, a fourth line (hereinafter referred to as a "fourth repair line") 104 and a fifth line (hereinafter referred to as a "fifth repair line") 105 are provided in the non-display region F.

The plurality of first repair lines 101 and the plurality of second repair lines 102 are located in the second area F2 of the non-display region F. Each first repair line 101 crosses non-input-side end portions 11b of some source bus lines 11 of the first bus line group 11G1 with an insulating layer interposed therebetween. In contrast, each second repair line 102 crosses the non-input-side end portions 11b of some source bus lines 11 of the second bus line group 11G2 with an insulating layer interposed therebetween. In the present embodiment, primary portions of the first repair line 101 and the second repair line 102 are produced from the same conductive film as the gate bus line 12 (i.e., from the gate metal layer), and cross the source bus lines 11 with the gate insulating film 15 interposed therebetween.

The third repair line 103 and the fourth repair line 104 are located in the first area F1 of the non-display region F. The third repair line 103 crosses the input-side end portion 11a of the first bus line group 11G1 with an insulating layer interposed therebetween, and does not cross the second bus line group 11G2. In contrast, the fourth repair line 104 crosses the input-side end portion 11a of the second bus line group 11G2 with an insulating layer interposed therebetween, and does not cross the first bus line group 11G1. The third repair line 103 and the fourth repair line 104 are electrically separated from each other. In the present embodiment, primary portions of the third repair line 103 and the fourth repair line 104 are produced from the gate metal layer, and cross the source bus line 11 with the gate insulating film 15 interposed therebetween.

The fifth repair line 105 is routed so as to cross the first repair lines 101, the second repair lines 102, the third repair line 103 and the fourth repair line 104 with an insulating layer interposed therebetween. Specifically, the fifth repair line 105 is routed so as to extend from the first area F1 to the second area F2 via the third area F3 of the non-display region F. Primary portions of the fifth repair line 105 are produced from the gate metal layer. In the present embodiment, the fifth repair line 105 has portions thereof that are formed outside the TFT substrate 10. Specifically, the fifth repair line 105 has portions thereof that are formed on the first FPC 50, the source-side PWB and the second FPC 60. Thus, portions of the fifth repair line 105 can be formed outside the TFT substrate 10. A portion 105a of the fifth repair line 105 that is located in the first area F1 of the non-display region F is connected to an external connection terminal 51 of the first FPC 50, with an amplification circuit 52 arranged subsequent to the external connection terminal 51.

An end portion 103a of the third repair line 103 that is closer to the fourth repair line 104 crosses the fifth repair line 105. On the other hand, an end portion 104a of the fourth repair line 104 that is closer to the third repair line 103 crosses the fifth repair line 105. A portion (the end portion 103a) of the third repair line 103 that crosses the fifth repair line 105 is produced from the same conductive film as the source bus line 11 (i.e., from the source metal layer). A portion (the end portion 104a) of the fourth repair line 104 that crosses the fifth repair line 105 is also produced from the source metal layer. Similarly, portions of the first repair line 101 and the second repair line 102 that cross the fifth repair line 105 are also produced from the source metal layer. Portions of the first repair line 101, the second repair line 102, the third repair line 103 and the fourth repair line 104 that are produced from the source metal layer are electrically connected, at appropriate positions, to portions thereof that are produced from the gate metal layer.

Next, a defect repairing wiring structure corresponding to the third block D3 and the fourth block D4 of the display region D will be described.

A plurality of sixth lines (hereinafter referred to as "sixth repair lines") 106 and a plurality of seventh lines (hereinafter referred to as "seventh repair lines") 107 are provided in the non-display region F of the liquid crystal display device 100, as shown in FIG. 1. An eighth line (hereinafter referred to as an "eighth repair line") 108, a ninth line (hereinafter referred to as a "ninth repair line") 109 and a tenth line (hereinafter referred to as a "tenth repair line") 110 are provided in the non-display region F.

The plurality of sixth repair lines 106 and the plurality of seventh repair lines 107 are located in the second area F2 of the non-display region F. Each sixth repair line 106 crosses the non-input-side end portions 11b of some source bus lines 11 of the third bus line group 11G3 with an insulating layer interposed therebetween. In contrast, each seventh repair line 107 crosses the non-input-side end portions 11b of some source bus lines 11 of the fourth bus line group 11G4 with an insulating layer interposed therebetween. In the present embodiment, primary portions of the sixth repair line 106 and the seventh repair line 107 are produced from the gate metal layer, and cross the source bus line 11 with the gate insulating film 15 interposed therebetween.

The eighth repair line 108 and the ninth repair line 109 are located in the first area F1 of the non-display region F. The eighth repair line 108 crosses the input-side end portion 11a of the third bus line group 11G3 with an insulating layer interposed therebetween, and does not cross the fourth bus line group 11G4. In contrast, the ninth repair line 109 crosses the input-side end portion 11a of the fourth bus line group 11G4 with an insulating layer interposed therebetween, and does not cross the third bus line group 11G3. The eighth repair line 108 and the ninth repair line 109 are electrically separated from each other. In the present embodiment, primary portions of the eighth repair line 108 and the ninth repair line 109 are produced from the gate metal layer, and cross the source bus line 11 with the gate insulating film 15 interposed therebetween.

The tenth repair line 110 is routed so as to cross the sixth repair lines 106, the seventh repair lines 107, the eighth repair line 108 and the ninth repair line 109 with an insulating layer interposed therebetween. Specifically, the tenth repair line 110 is routed so as to extend from the first area F1 to the second area F2 via the fourth area F4 of the non-display region F. Primary portions of the tenth repair line 110 are produced from the gate metal layer. In the present embodiment, the tenth repair line 110 has portions thereof that are formed outside the TFT substrate 10. Specifically, the tenth repair line 110 has portions thereof that are formed on the first FPC 50 and the source-side PWB. Thus, portions of the tenth repair line 110 can be formed outside the TFT substrate 10. A portion 110a of the tenth repair line 110 that is located in the first area F1 of the non-display region F is connected to the external connection terminal 51 of the first FPC 50, with the amplification circuit 52 arranged subsequent to the external connection terminal 51.

An end portion 108a of the eighth repair line 108 that is closer to the ninth repair line 109 crosses the tenth repair line 110. An end portion 109a of the ninth repair line 109 that is closer to the eighth repair line 108 crosses the tenth repair line 110. A portion (the end portion 108a) of the eighth repair line 108 that crosses the tenth repair line 110 is produced from the source metal layer. A portion (the end portion 109a) of the ninth repair line 109 that crosses the tenth repair line 110 is also produced from the source metal layer. Similarly, portions of the sixth repair line 106 and the seventh repair line 107 that cross the tenth repair line 110 are also produced from the source metal layer. Portions of the sixth repair line 106, the seventh repair line 107, the eighth repair line 108 and the ninth repair line 109 that are produced from the source metal layer are electrically connected, at appropriate positions, to portions thereof that are produced from the gate metal layer. The fifth repair line 105 and the tenth repair line 110 are electrically separated from each other.

The liquid crystal display device 100 of the present embodiment further includes additional defect repairing wiring structures corresponding respectively to the first block D1 and the second block D2 of the display region D, and to the third block D3 and the fourth block D4 of the display region D.

First, the additional defect repairing wiring structure corresponding to the first block D1 and the second block D2 of the display region D will be described.

A plurality of eleventh lines (hereinafter referred to as "eleventh repair lines") 111 and a plurality of twelfth lines (hereinafter referred to as "twelfth repair lines") 112 are provided in the non-display region F of the liquid crystal display device 100, as shown in FIG. 1. A thirteenth line (hereinafter referred to as a "thirteenth repair line") 113 and a fourteenth line (hereinafter referred to as a "fourteenth repair line") 114 are provided in the non-display region F.

The plurality of eleventh repair lines 111 and the plurality of twelfth repair lines 112 are located in the second area F2 of the non-display region F. Each eleventh repair line 111 crosses non-input-side end portions 11b of some source bus lines 11 of the first bus line group 11G1 with an insulating layer interposed therebetween. In contrast, each twelfth repair line 112 crosses the non-input-side end portions 11b of some source bus lines 11 of the second bus line group 11G2 with an insulating layer interposed therebetween. In the present embodiment, primary portions of the eleventh repair line 111 and the twelfth repair line 112 are produced from the gate metal layer, and cross the source bus line 11 with the gate insulating film 15 interposed therebetween.

The thirteenth repair line 113 crosses the input-side end portion 11a of the first bus line group 11G1 with an insulating layer interposed therebetween, and does not cross the second bus line group 11G2. The thirteenth repair line 113 is routed so as to also cross the eleventh repair line 111 with an insulating layer interposed therebetween. Specifically, the thirteenth repair line 113 is routed so as to extend from the first area F1 to the second area F2 via the third area F3 of the non-display region F. In the present embodiment, the thirteenth repair line 113 has portions thereof that are formed outside the TFT substrate 10. Specifically, the thirteenth repair line 113 has portions thereof that are formed on the first FPC 50, the source-side PWB and the second FPC 60. Thus, portions of the thirteenth repair line 113 can be formed outside the TFT substrate 10. A portion of the thirteenth repair line 113 that is located in the first area F1 of the non-display region F is connected to the external connection terminal 51 of the first FPC 50, with the amplification circuit 52 arranged subsequent to the external connection terminal 51.

The fourteenth repair line 114 crosses the input-side end portion 11a of the second bus line group 11G2 with an insulating layer interposed therebetween, and does not cross the first bus line group 11G1. The fourteenth repair line 114 is routed so as to also cross the twelfth repair line 112 with an insulating layer interposed therebetween. Specifically, the fourteenth repair line 114 is routed so as to extend from the first area F1 to the second area F2 via the third area F3 of the non-display region F. In the present embodiment, the fourteenth repair line 114 has portions thereof that are formed outside the TFT substrate 10. Specifically, the fourteenth repair line 114 has portions thereof that are formed on the first FPC 50, the source-side PWB and the second FPC 60. Thus, portions of the fourteenth repair line 114 can be formed outside the TFT substrate 10. A portion of the fourteenth repair line 114 that is located in the first area F1 of the non-display region F is connected to the external connection terminal 51 of the first FPC 50, with the amplification circuit 52 arranged subsequent to the external connection terminal 51.

The thirteenth repair line 113 and the fourteenth repair line 114 are electrically separated from each other.

In the present embodiment, primary portions of the thirteenth repair line 113 and the fourteenth repair line 114 are produced from the gate metal layer, and cross the source bus line 11 with the gate insulating film 15 interposed therebetween. A portion of the eleventh repair line 111 that crosses the thirteenth repair line 113 is produced from the source metal layer, and a portion of the twelfth repair line 112 that crosses the fourteenth repair line 114 is also produced from the source metal layer. Portions of the eleventh repair line 111 and the twelfth repair line 112 that are produced from the source metal layer are electrically connected, at appropriate positions, to portions thereof that are produced from the gate metal layer.

Next, the additional defect repairing wiring structure corresponding to the third block D3 and the fourth block D4 of the display region D will be described.

A plurality of fifteenth lines (hereinafter referred to as "fifteenth repair lines") 115 and a plurality of sixteenth lines (hereinafter referred to as "sixteenth repair lines") 116 are provided in the non-display region F of the liquid crystal display device 100, as shown in FIG. 1. A seventeenth line (hereinafter referred to as a "seventeenth repair line") 117 and a eighteenth line (hereinafter referred to as an "eighteenth repair line") 118 are provided in the non-display region F.

The plurality of fifteenth repair lines 115 and the plurality of sixteenth repair lines 116 are located in the second area F2 of the non-display region F. Each fifteenth repair line 115 crosses non-input-side end portions 11b of some source bus lines 11 of the third bus line group 11G3 with an insulating layer interposed therebetween. In contrast, each sixteenth repair line 116 crosses the non-input-side end portions 11b of some source bus lines 11 of the fourth bus line group 11G4 with an insulating layer interposed therebetween. In the present embodiment, primary portions of the fifteenth repair line 115 and the sixteenth repair line 116 are produced from the gate metal layer, and cross the source bus line 11 with the gate insulating film 15 interposed therebetween.

The seventeenth repair line 117 crosses the input-side end portion 11a of the third bus line group 11G3 with an insulating layer interposed therebetween, and does not cross the fourth bus line group 11G4. The seventeenth repair line 117 is routed so as to also cross the fifteenth repair line 115 with an insulating layer interposed therebetween. Specifically, the seventeenth repair line 113 is routed so as to extend from the first area F1 to the second area F2 via the fourth area F4 of the non-display region F. In the present embodiment, the seventeenth repair line 117 has portions thereof that are formed outside the TFT substrate 10. Specifically, the seventeenth repair line 117 has portions thereof that are formed on the first FPC 50 and the source-side PWB. Thus, portions of the seventeenth repair line 117 can be formed outside the TFT substrate 10. A portion of the seventeenth repair line 117 that is located in the first area F1 of the non-display region F is connected to the external connection terminal 51 of the first FPC 50, with the amplification circuit 52 arranged subsequent to the external connection terminal 51.

The eighteenth repair line 118 crosses the input-side end portion 11a of the fourth bus line group 11G2 with an insulating layer interposed therebetween, and does not cross the third bus line group 11G3. The eighteenth repair line 118 is routed so as to also cross the sixteenth repair line 116 with an insulating layer interposed therebetween. Specifically, the eighteenth repair line 118 is routed so as to extend from the first area F1 to the second area F2 via the fourth area F4 of the non-display region F. In the present embodiment, the eighteenth repair line 118 has portions thereof that are formed outside the TFT substrate 10. Specifically, the eighteenth repair line 118 has portions thereof that are formed on the first FPC 50 and the source-side PWB. Thus, portions of the eighteenth repair line 118 can be formed outside the TFT substrate 10. A portion of the eighteenth repair line 118 that is located in the first area F1 of the non-display region F is connected to the external connection terminal 51 of the first FPC 50, with the amplification circuit 52 arranged subsequent to the external connection terminal 51.

The seventeenth repair line 117 and the eighteenth repair line 118 are electrically separated from each other. In the present embodiment, primary portions of the seventeenth repair line 117 and the eighteenth repair line 118 are produced from the gate metal layer, and cross the source bus line 11 with the gate insulating film 15 interposed therebetween. A portion of the fifteenth repair line 115 that crosses the seventeenth repair line 117 is produced from the source metal layer, and a portion of the sixteenth repair line 116 that crosses the eighteenth repair line 118 is also produced from the source metal layer. Portions of the fifteenth repair line 115 and the sixteenth repair line 116 that are produced from the source metal layer are electrically connected, at appropriate positions, to portions thereof that are produced from the gate metal layer.

A method for repairing a display defect when a wire break has occurred along the source bus line 11 in the liquid crystal display device 100 having such a wiring structure as described above will be described. Although the following description will focus on the first block D1 and the second block D2 of the display region D, the repairing of a display defect can be done similarly as described below also for the third block D3 and the fourth block D4.

First, one or more of the source bus lines 11 of the first bus line group 11G1 and the second bus line group 11G2 that has a wire break is identified. This step (broken bus line identifying step) can be carried out by visually checking the display while predetermined test signals are being input to the source bus lines 11, the gate bus lines 12 and the counter electrode 23. Pixels that are connected to a broken source bus line 11 and that are downstream of the wire break location are not properly receiving the display signal, and the pixels will produce a display that is different from an intended display. With a normally white display, for example, when a test signal such that pixels are supposed to be in black is input, pixels that are connected to a broken source bus line 11 and that are downstream of the wire break location will remain in white.

Next, a wiring path is formed that includes one of the first repair line 101 and the second repair line 102, one of the third repair line 103 and the fourth repair line 104, and the fifth repair line 105, and that electrically connects between the input-side end portion 11a and the non-input-side end portion 11b of the source bus line 11 which has been identified as having a wire break. Where the identified source bus line 11 is a source bus line 11 of the first bus line group 11G1, this step (wiring path formation step) includes the step of electrically connecting the identified source bus line 11 with the first repair line 101, the third repair line 103 and the fifth repair line 105. Where the identified source bus line 11 is a source bus line 11 of the second bus line group 11G2, the wiring path formation step includes the step of electrically connecting the identified source bus line 11 with the second repair line 102, the fourth repair line 104 and the fifth repair line 105. This wiring path formation step will now be described in greater detail.

Figure 4:
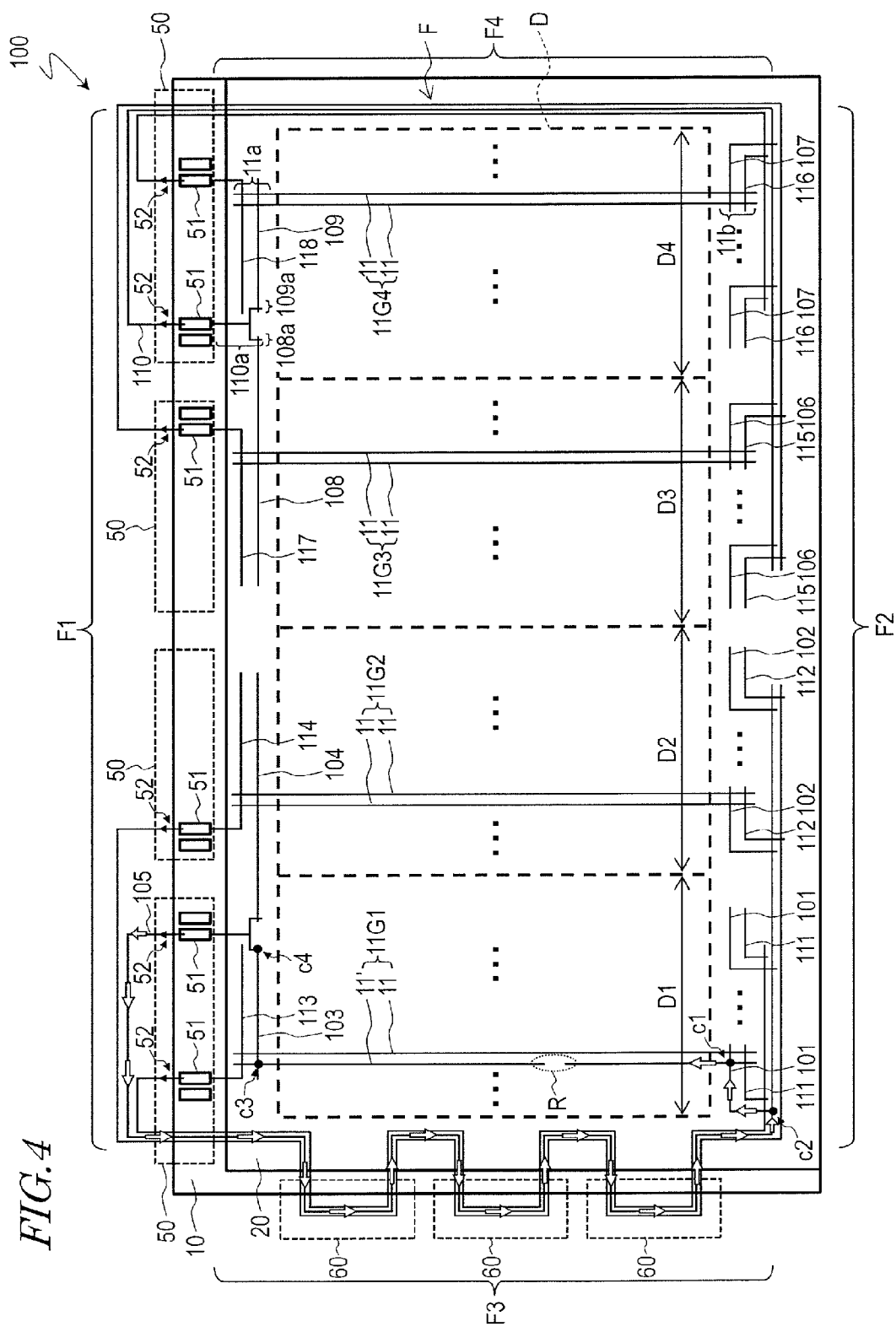
FIG. 4 A plan view schematically showing the liquid crystal display device 100 according to an embodiment of the present invention.

If a wire break occurs along a certain source bus line 11' of the first bus line group 11G1 (at the wire break location R), as shown in FIG. 4, the intersection (the connection location c1) between the source bus line 11' and the first repair line 101 is irradiated with laser light to make a connection therebetween. Moreover, the intersection (the connection location c2) between the first repair line 101 and the fifth repair line 105 is irradiated with laser light to make a connection therebetween. Furthermore, the intersection (the connection location c3) between the source bus line 11' and the third repair line 103 is irradiated with laser light to make a connection therebetween, and the intersection (the connection location c4) between the third repair line 103 and the fifth repair line 105 is irradiated with laser light to make a connection therebetween. The laser light irradiation can be done by using a YAG laser, for example.

By making a connection at these four locations, there is formed a wiring path electrically connecting together the input-side end portion 11a and the non-input-side end portion 11b of the broken source bus line 11', thereby supplying a display signal through this wiring path to a portion of the source bus line 11' that is downstream of the wire break location R (as schematically indicated by white arrows in FIG. 4).

Figure 5:
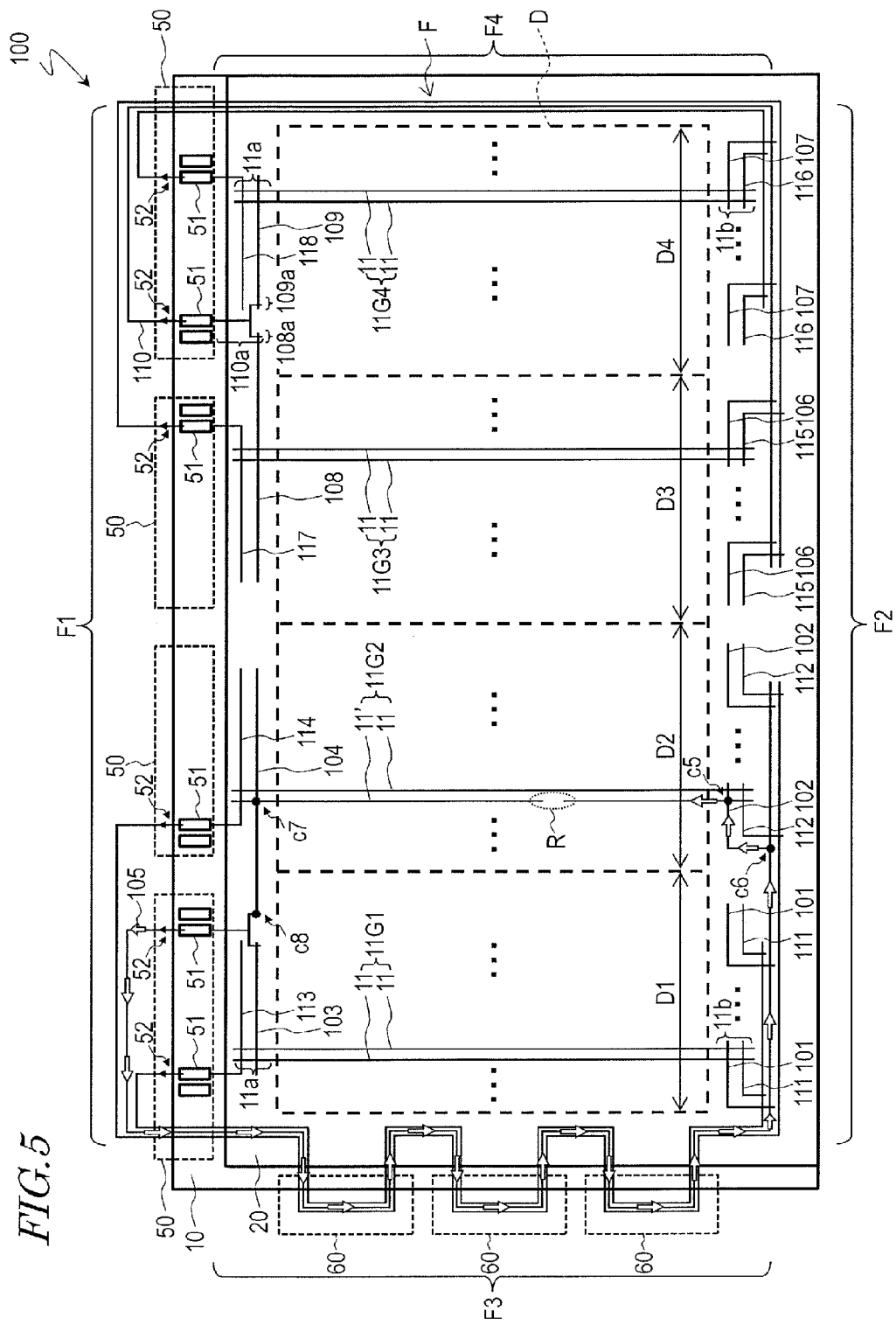
FIG. 5 A plan view schematically showing the liquid crystal display device 100 according to an embodiment of the present invention.

In contrast, if a wire break occurs along a certain source bus line 11' of the second bus line group 11G2 (at the wire break location R), as shown in FIG. 5, the intersection (the connection location c5) between the source bus line 11' and the second repair line 102 is irradiated with laser light to make a connection therebetween. Moreover, the intersection (the connection location c6) between the second repair line 102 and the fifth repair line 105 is irradiated with laser light to make a connection therebetween. Furthermore, the intersection (the connection location c7) between the source bus line 11' and the fourth repair line 104 is irradiated with laser light to make a connection therebetween, and the intersection (the connection location c8) between the fourth repair line 104 and the fifth repair line 105 is irradiated with laser light to make a connection therebetween.

By making a connection at these four locations, there is formed a wiring path electrically connecting together the input-side end portion 11a and the non-input-side end portion 11b of the broken source bus line 11', thereby supplying a display signal through this wiring path to a portion of the source bus line 11' that is downstream of the wire break location R (as schematically indicated by white arrows in FIG. 5).

Such a defect repairing method can be suitably carried out as one step of a method for manufacturing the liquid crystal display device 100. For example, the step of producing (providing) the liquid crystal display device 100 with the TFT substrate 10 having such a wiring structure as described above may be followed by a step of repairing any display defect of the liquid crystal display device 100 by using the defect repairing method described above. The step of providing the liquid crystal display device 100 can be performed by using a known method. The liquid crystal display device 100 to be provided before the step of repairing a display defect may have some components (e.g., a polarizer) yet to be attached thereto.

Note that in the present embodiment, the third repair line 103 provided corresponding to the first bus line group 11G1 is electrically separated from the fourth repair line 104 provided corresponding to the second bus line group 11G2. Alternatively, a configuration of a liquid crystal display device 700 of a comparative example shown in FIG. 6 may be employed.

Figure 6:
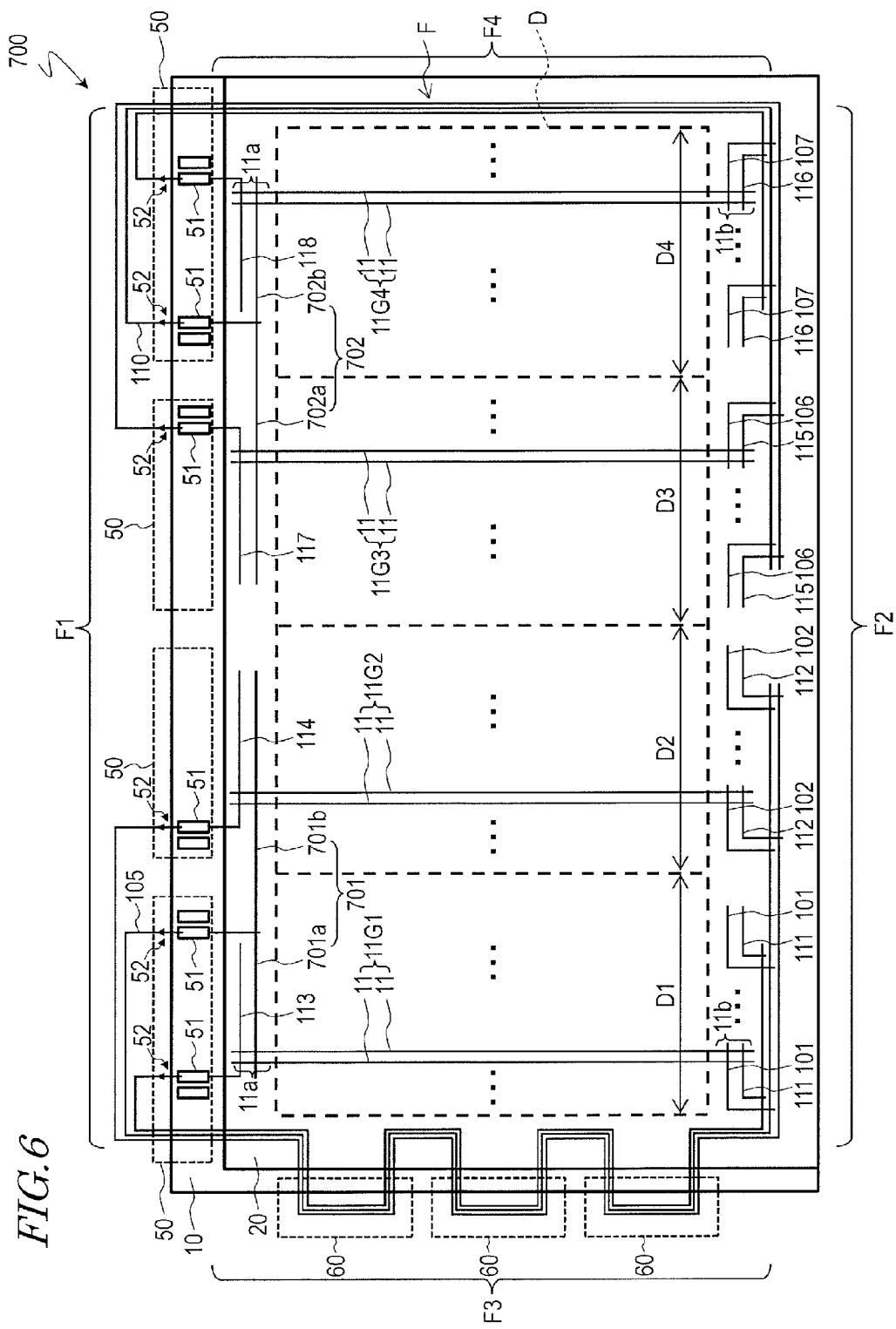
FIG. 6 A plan view schematically showing a liquid crystal display device 700 of a comparative example.

The liquid crystal display device 700 of the comparative example shown in FIG. 6 includes a line 701 of which a portion 701a corresponding to the first bus line group 11G1 and a portion 701b corresponding to the second bus line group 11G2 are continuous with each other (i.e., electrically connected to each other), instead of the third repair line 103 and the fourth repair line 104 of the liquid crystal display device 100. Moreover, a line 702 is provided, of which a portion 702a corresponding to the third bus line group 11G3 and a portion 702b corresponding to the fourth bus line group 11G4 are continuous with each other (i.e., electrically connected to each other), instead of the eighth repair line 108 and the ninth repair line 109 of the liquid crystal display device 100.

Where a defect is repaired by using the line 701 in the liquid crystal display device 700 of the comparative example, since the line 701 crosses more source bus lines 11 than the third repair line 103 or the fourth repair line 104 of the liquid crystal display device 100, the line 701 has a larger capacitance (load), which may delay the display signal.

In contrast, with the liquid crystal display device 100 of the present embodiment, where the third repair line 103 and the fourth repair line 104 are electrically separated from each other, it is possible to reduce the delay of the display signal arising from the capacitance (load) of the repair line used for repairing, and it is not necessary to cut off, by way of laser light irradiation, a repair line (the third repair line 103 or the fourth repair line 104) to be used for repairing. Thus, it is possible to more reliably repair a defect even if the liquid crystal display panel is a high-definition panel.

Moreover, in the liquid crystal display device 100 of the present embodiment, the third repair line 103 and the fourth repair line 104 are both crossing the fifth repair line 105, and a wiring path including the third repair line 103 and a wiring path including the fourth repair line 104 can share one external connection terminal (and one amplification circuit 52) therebetween.

Therefore, only with one external connection terminal 51 (and one amplification circuit 52), it is possible to repair wire breaks along source bus lines 11 (repair display defects arising from wire breaks) over a wide area. Therefore, the liquid crystal display device 100 of the present embodiment is advantageous for reducing the bezel width.

Note that the liquid crystal display device 100 of the present embodiment is capable of repairing a defect by using the eleventh repair line 111, the twelfth repair line 112, the thirteenth repair line 113 and the fourteenth repair line 114. This can be done by forming a wiring path that includes one of the eleventh repair line 111 and the twelfth repair line 112 and one of the thirteenth repair line 113 and the fourteenth repair line 114, and that electrically connects between the input-side end portion 11a and the non-input-side end portion 11b of the source bus line 11 which has been identified as having a wire break. Where the identified source bus line 11 is a source bus line 11 of the first bus line group 11G1, this step (wiring path formation step) includes the step of electrically connecting the identified source bus line 11 with the eleventh repair line 111 and the thirteenth repair line 113. Where the identified source bus line 11 is a source bus line 11 of the second bus line group 11G2, the wiring path formation step includes the step of electrically connecting the identified source bus line 11 with the twelfth repair line 112 and the fourteenth repair line 114. This wiring path formation step will now be described in greater detail.

Figure 7:
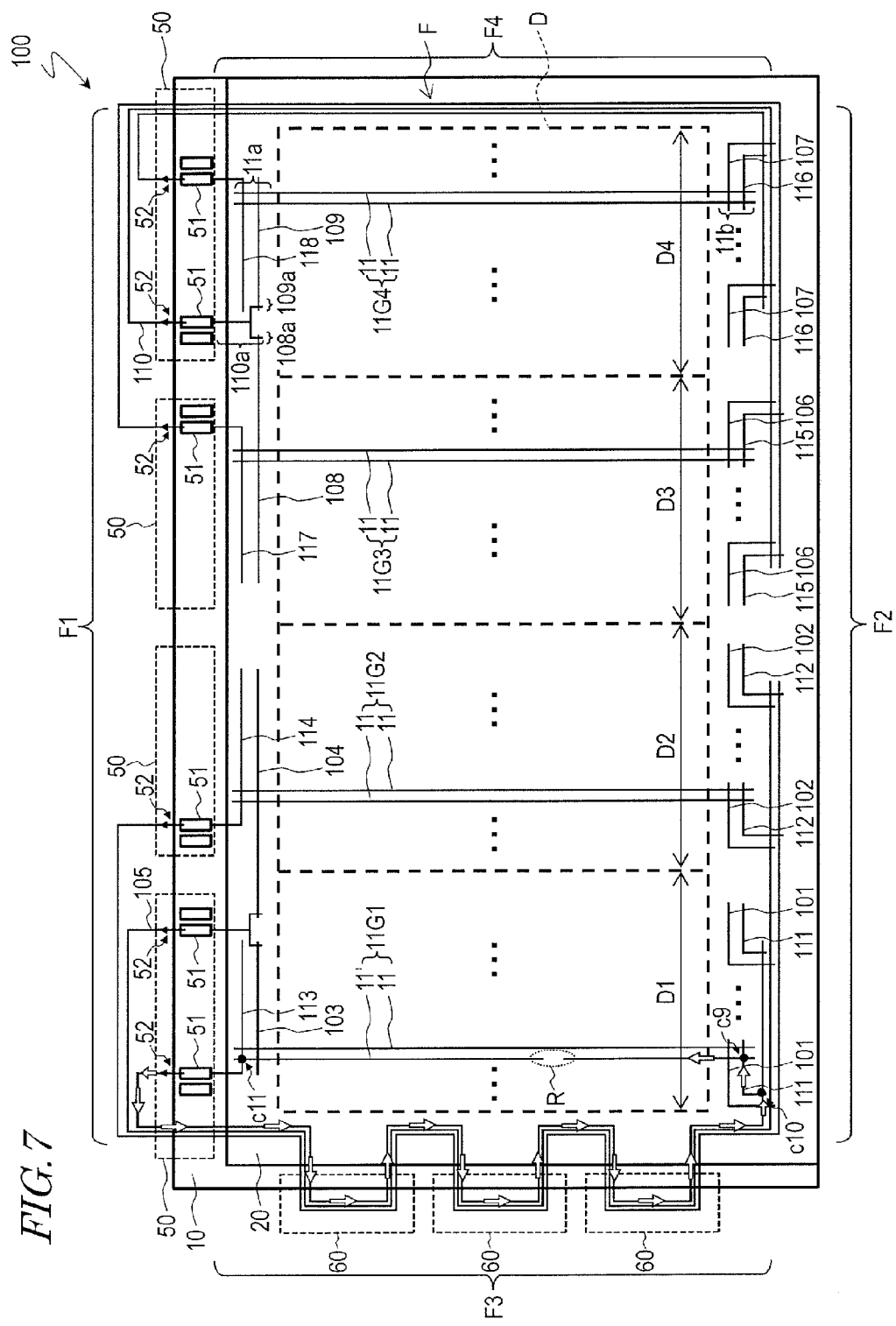
FIG. 7 A plan view schematically showing the liquid crystal display device 100 according to an embodiment of the present invention.

If a wire break occurs along a certain source bus line 11' of the first bus line group 11G1 (at the wire break location R), as shown in FIG. 7, the intersection (the connection location c9) between the source bus line 11' and the first repair line 111 is irradiated with laser light to make a connection therebetween. Moreover, the intersection (the connection location c10) between the eleventh repair line 111 and the thirteenth repair line 113 is irradiated with laser light to make a connection therebetween. Furthermore, the intersection (the connection location c11) between the source bus line 11' and the thirteenth repair line 113 is irradiated with laser light to make a connection therebetween.

By making a connection at these three locations, there is formed a wiring path electrically connecting together the input-side end portion 11a and the non-input-side end portion 11b of the broken source bus line 11', thereby supplying a display signal through this wiring path to a portion of the source bus line 11' that is downstream of the wire break location R (as schematically indicated by white arrows in FIG. 7).

Figure 8:
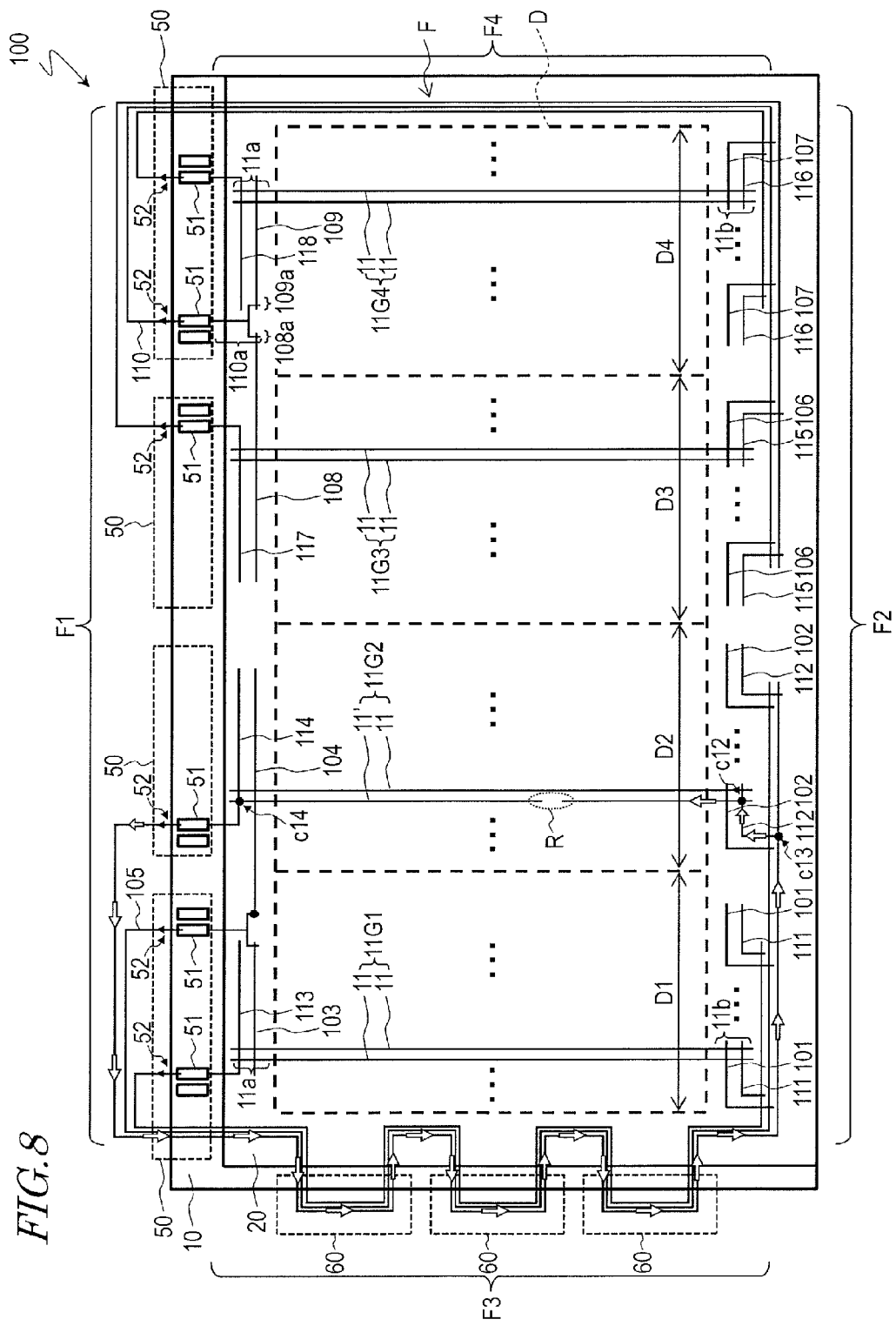
FIG. 8 A plan view schematically showing the liquid crystal display device 100 according to an embodiment of the present invention.

In contrast, if a wire break occurs along a certain source bus line 11' of the second bus line group 11G2 (at the wire break location R), as shown in FIG. 8, the intersection (the connection location c12) between the source bus line 11' and the second repair line 112 is irradiated with laser light to make a connection therebetween. Moreover, the intersection (the connection location c13) between the twelfth repair line 112 and the fourteenth repair line 114 is irradiated with laser light to make a connection therebetween. Furthermore, the intersection (the connection location c14) between the source bus line 11' and the fourteenth repair line 114 is irradiated with laser light to make a connection therebetween.

By making a connection at these three locations, there is formed a wiring path electrically connecting together the input-side end portion 11a and the non-input-side end portion 11b of the broken source bus line 11', thereby supplying a display signal through this wiring path to a portion of the source bus line 11' that is downstream of the wire break location R (as schematically indicated by white arrows in FIG. 8).

Note that where a wire break has occurred along only one source bus line 11 of the first bus line group 11G1 and the second bus line group 11G2 (i.e., the first block D1 and the second block D2 of the display region D), it is preferable to preferentially perform a defect repairing by using the eleventh repair line 111, the twelfth repair line 112, the thirteenth repair line 113 and the fourteenth repair line 114 (the defect repairing shown in FIGS. 7 and 8). This is because the defect repairing using the eleventh repair line 111, the twelfth repair line 112, the thirteenth repair line 113 and the fourteenth repair line 114 involves fewer connection locations than the defect repairing using the first repair line 101, the second repair line 102, the third repair line 103, the fourth repair line 104 and the fifth repair line 105 (the defect repairing shown in FIGS. 4 and 5).

As already described above, primary portions of the third repair line 103, the fourth repair line 104 and the fifth repair line 105 are produced from the gate metal layer, and the third repair line 103 and the fourth repair line 104 therefore switch from the gate metal layer to the source metal layer in the vicinity of the intersection thereof with the fifth repair line 105, so as to allow the third repair line 103 and the fourth repair line 104 to overlap with the fifth repair line 105 (i.e., to cross the fifth repair line 105 with an insulating layer interposed therebetween). Each portion where such switching is done will be hereinafter referred to as a contact portion.

With such a configuration, it is possible to more reliably protect those lines that are extended into an area (a so-called "driver region") of the TFT substrate 10 that is not covered by the counter substrate 20. When using a bottom gate-type TFT 13 having an amorphous silicon layer or an oxide semiconductor layer as the semiconductor layer 13d, since the gate metal layer is covered by a larger amount of an insulating layer than the source metal layer (specifically, by the amount of the gate insulating film 15), a more reliable protection can be provided if the lines (the third repair line 103, the fourth repair line 104 and the fifth repair line 105) are produced from the gate metal layer in the driver region. For a similar reason, it is preferred that portions of the source bus lines 11 extended into the driver region are also produced from the gate metal layer (i.e., the source bus lines 11 switch from the source metal layer to the gate metal layer when the source bus lines 11 are extended into the driver region).

Figure 9:
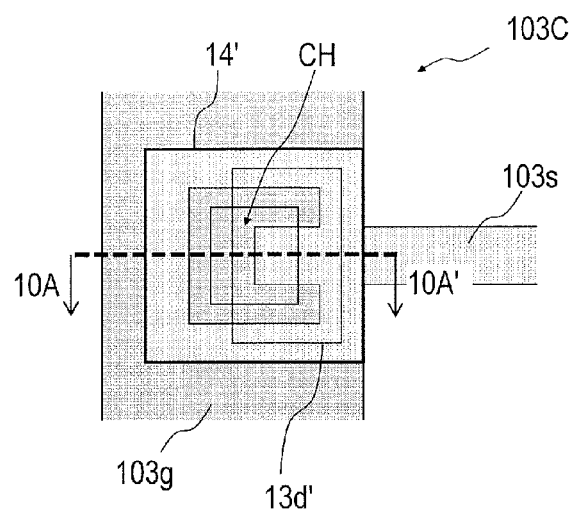
FIG. 9 A plan view schematically showing an area around a contact portion 103C of a third line 103 of the liquid crystal display device 100.
Figure 10:
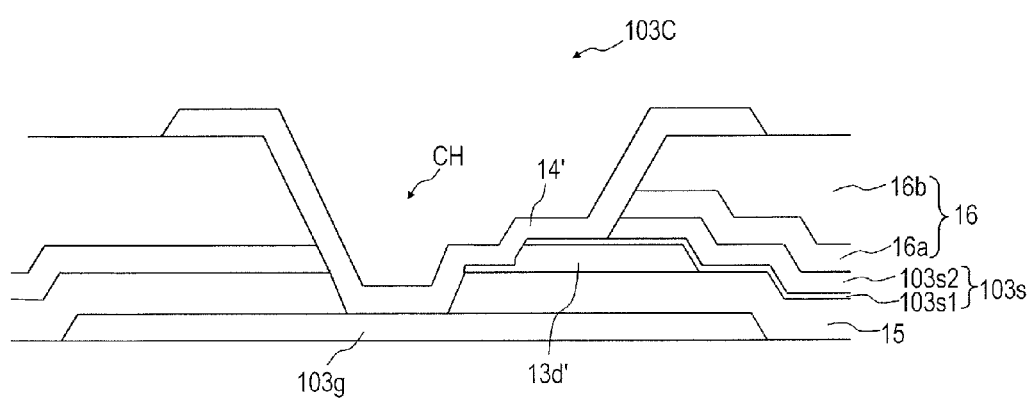
FIG. 10 A cross-sectional view schematically showing an area around the contact portion 103C of the third line 103 of the liquid crystal display device 100, taken along line 10A-10A' of FIG. 9.

Referring now to FIGS. 9 and 10, an example structure around the contact portion 103C of the third repair line 103 will be illustrated. FIG. 9 is a plan view schematically showing an area around the contact portion 103C, and FIG. 10 is a cross-sectional view taken along line 10A-10A' of FIG. 9. Note that in the following description, a portion of the third repair line 103 that is produced from the gate metal layer will be referred to as the "gate layer", and a portion thereof that is produced from the source metal layer will be referred to as the "source layer".

In the contact portion 103C, a contact hole CH is formed in the gate insulating film 15 and the interlayer insulating film (herein, a passivation layer 16a and an organic insulating layer 16b) 16 so as to expose the gate layer 103g of the third repair line 103 therethrough, as shown in FIGS. 9 and 10. A connection electrode 14', which is produced from the same conductive film as the pixel electrode 14, is provided so as to cover the contact hole CH. The gate layer 103g and the source layer 103s of the third repair line 103 are electrically connected to each other via the connection electrode 14'.

Also in the contact portion of the source bus line 11, the switching from the source metal layer to the gate metal layer can be made by using such a structure. Note that the source layer 103s has a layered structure including a lower layer (e.g., a Ti layer) 103s1 and an upper layer (e.g., an Al layer) 103s2, and a semiconductor layer 13d' produced from the same semiconductor film as the semiconductor layer 13d of the TFT 13 is provided in the contact portion 103C in the example illustrated herein, but it is understood that there is no particular limitation on the structure of the contact portion 103C.

Note that the primary portion of the fifth repair line 105 (a portion formed on the TFT substrate 10) may be produced from the same conductive film as the source bus line 11 (i.e., from the source metal layer). If the fifth repair line 105 is produced from the source metal layer, such a contact portion as described above is no longer needed, thereby eliminating contact resistance. Since there is no longer a need to form the contact portion, there is no contact failure, which makes it possible to further improve the production yield.

As already described above, the primary portion of the fifth repair line 105 (a portion formed on the TFT substrate 10) may be produced from the same conductive film as the gate bus line 12 (i.e., from the gate metal layer). The configuration where the fifth repair line 105 is produced from the gate metal layer is preferable in view of the protection of the fifth repair line 105.

Note that the present embodiment is directed to an example where the display region D is divided into four blocks (i.e., where the plurality of source bus lines 11 are grouped into four bus line groups), but the number of blocks into which the display region D is divided (i.e., the number of bus line groups) is not limited to four. The number of blocks into which the display region D is divided (i.e., the number of bus line groups) may be five or more, or three or less.

Embodiment 2

Figure 11:
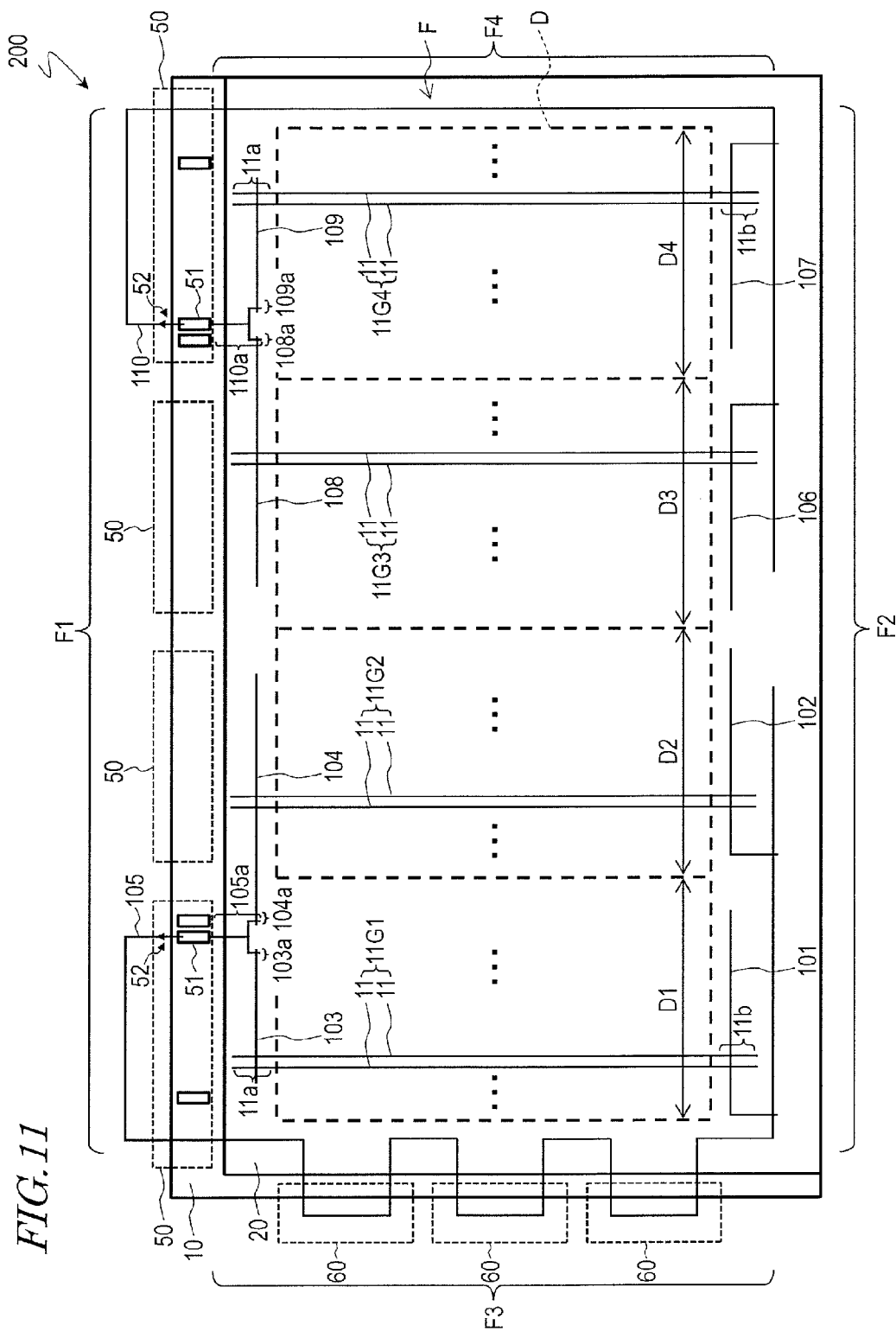
FIG. 11 A plan view schematically showing a liquid crystal display device 200 according to an embodiment of the present invention.

FIG. 11 shows a liquid crystal display device 200 of the present embodiment. FIG. 11 is a plan view schematically showing the liquid crystal display device 200. The following description will focus on how the liquid crystal display device 200 differs from the liquid crystal display device 100 of Embodiment 1.

The liquid crystal display device 200 of the present embodiment differs from the liquid crystal display device 100 of Embodiment 1 in that the eleventh to eighteenth repair lines 111 to 118 are absent, as shown in FIG. 11. By omitting the eleventh to eighteenth repair lines 111 to 118, it is possible to reduce the bezel width.

Note that the first to tenth repair lines 101 to 110 may be omitted instead of omitting the eleventh to eighteenth repair lines 111 to 118, but it is more preferable to omit the eleventh to eighteenth repair lines 111 to 118 as in the present embodiment. By keeping the first to tenth repair lines 101 to 110, there can be fewer external connection terminals 51 and fewer amplification circuits 52, which allows for a greater reduction in the bezel width.

The liquid crystal display device 200 of the present embodiment differs from the liquid crystal display device 100 of Embodiment 1 also in that there is only one each of the first repair line 101, the second repair line 102, the sixth repair line 106 and the seventh repair line 107. The configuration where there is only one each of the first repair line 101, the second repair line 102, the sixth repair line 106 and the seventh repair line 107 as in the present embodiment is advantageous for reducing the bezel width. With a configuration where there are a plurality of the first repair lines 101, a plurality of the second repair lines 102, a plurality of the sixth repair lines 106 and a plurality of the seventh repair lines 107 as in the liquid crystal display device 100 of Embodiment 1, it is possible to improve the production yield because it increases the number of wire breaks that can be repaired within each block of the display region D.

Embodiment 3

Figure 12:
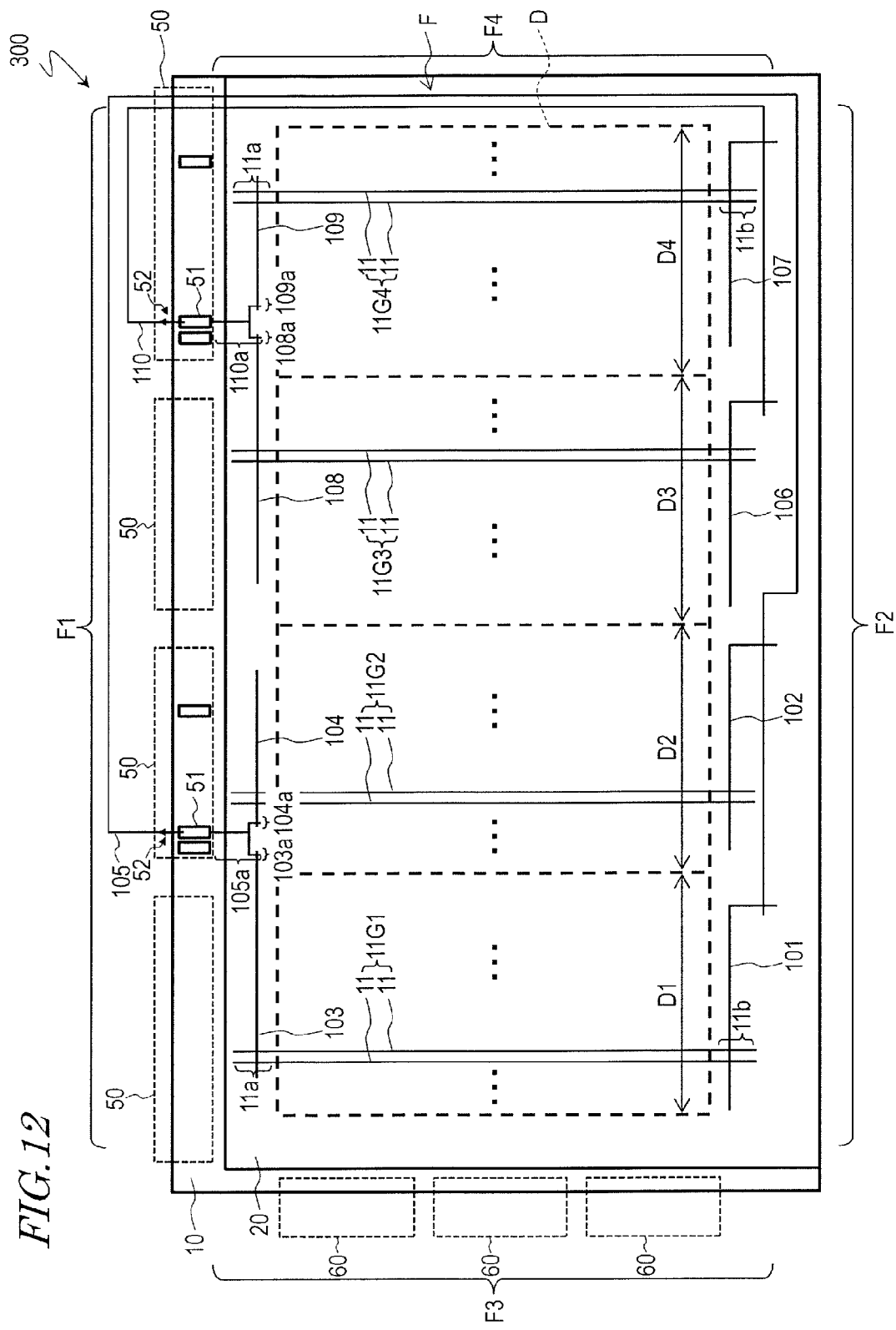
FIG. 12 A plan view schematically showing a liquid crystal display device 300 according to an embodiment of the present invention.

FIG. 12 shows the liquid crystal display device 300 of the present embodiment. FIG. 12 is a plan view schematically showing the liquid crystal display device 300. The following description will focus on how the liquid crystal display device 300 differs from the liquid crystal display device 200 of Embodiment 2.

The liquid crystal display device 300 of the present embodiment differs from the liquid crystal display device 200 of Embodiment 2 in that the fifth repair line 105 is routed so as not to run in the third area F3 of the non-display region F. The fifth repair line 105 of the liquid crystal display device 300 is routed so as to extend from the first area F1 to the second area F2 via the fourth area F4 of the non-display region F.

Although the fifth repair line 105 of the liquid crystal display device 200 of Embodiment 2 can be provided so that no portions thereof are formed on the second FPC 60 (i.e., so as not to run through the second FPC 60) in the third area F3, the fifth repair line 105 would cross the gate bus line 12 in such a case, thereby increasing the capacitance (load) of the fifth repair line 105.

In contrast, if the fifth repair line 105 is routed so as not to run in the third area F3 of the non-display region F as in the present embodiment, it is possible to avoid such an increase in the capacitance (load).

Embodiment 4

Figure 13:
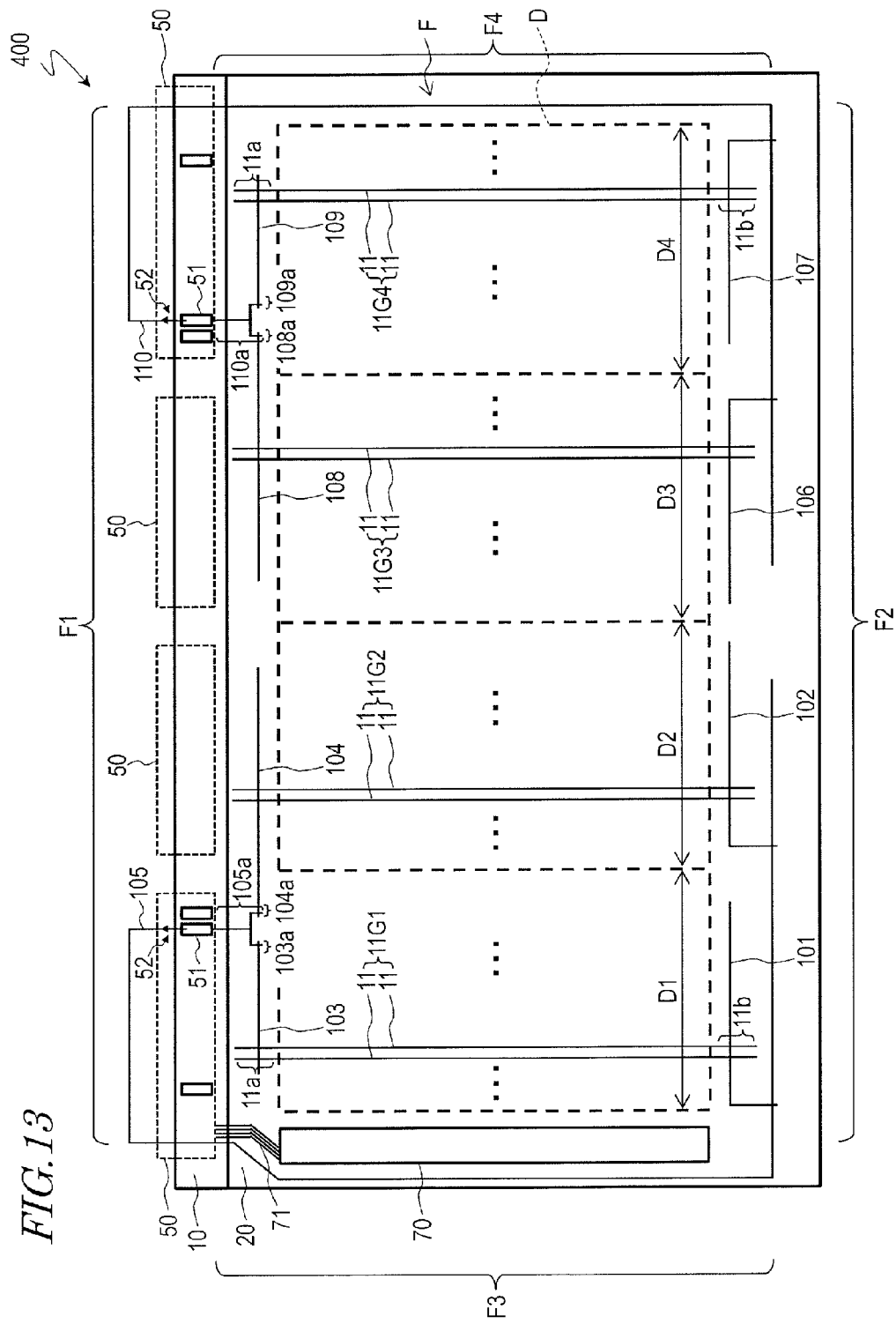
FIG. 13 A plan view schematically showing a liquid crystal display device 400 according to an embodiment of the present invention.

FIG. 13 shows a liquid crystal display device 400 of the present embodiment. FIG. 13 is a plan view schematically showing the liquid crystal display device 400. The following description will focus on how the liquid crystal display device 400 differs from the liquid crystal display device 200 of Embodiment 2.

The liquid crystal display device 400 of the present embodiment has no second FPC 60, but includes a gate driver 70 formed on the TFT substrate 10 in the third area F3 of the non-display region F. That is, the gate driver (gate driver circuit) 70 is formed integral (monolithic) on the TFT substrate 10. The fifth repair line 105 of the liquid crystal display device 400 is routed so as to run outside the gate driver 70 (and a gate driver line 71) in the third area F3 of the non-display region F. With such a configuration, it is possible to avoid an increase in the capacitance (load) of the fifth repair line 105.

As described above, the embodiments of the present invention provide an active matrix substrate having a structure suitable for repairing a display defect arising from a wire break along a bus line, and a display device having such an active matrix substrate.

Note that although the description above is directed to a liquid crystal display device and an active matrix substrate therefor, embodiments of the present invention are not limited to liquid crystal display devices and active matrix substrates therefor. Embodiments of the present invention can suitably be used also for other types of display devices, such as organic EL (Electro Luminescence) display devices and FEDs (Field Emission Displays), and active matrix substrates therefor.

While the description above is directed to a configuration having a wiring structure capable of repairing a display defect arising from a wire break along a source bus line, a display defect arising from a wire break along a gate bus line can also be repaired by providing a similar wiring structure for gate bus lines. Specifically, by providing the following five types of lines (repair lines) in a non-display region on an active matrix substrate including a plurality of gate bus lines, grouped into a plurality of bus line groups including a first bus line group and a second bus line group adjacent to the first bus line group, it is possible to repair a display defect arising from a wire break along a gate bus line.

(1) at least one first line each crossing a non-input-side end portion of at least one gate bus line of the first bus line group with an insulating layer interposed therebetween;

(2) at least one second line each crossing a non-input-side end portion of at least one gate bus line of the second bus line group with an insulating layer interposed therebetween;

(3) a third line crossing an input-side end portion of the first bus line group with an insulating layer interposed therebetween, and not crossing the second bus line group;

(4) a fourth line crossing an input-side end portion of the second bus line group with an insulating layer interposed therebetween, and not crossing the first bus line group, the fourth line being electrically separated from the third line; and (5) a fifth line routed so as to cross a first, second, third and fourth line with an insulating layer interposed therebetween.

INDUSTRIAL APPLICABILITY

Embodiments of the present invention provide an active matrix substrate having a structure suitable for repairing a display defect arising from a wire break along a bus line, and a display device having such an active matrix substrate.

REFERENCE SIGNS LIST

10 active matrix substrate (TFT substrate)
11 source bus line
11G1 first bus line group
11G2 second bus line group
11G3 third bus line group
11G4 fourth bus line group
12 gate bus line
13 thin film transistor (TFT)
14 pixel electrode
20 counter substrate (color filter substrate)
23 counter electrode
30 liquid crystal layer
50 first flexible printed circuit
60 second flexible printed circuit
100, 200, 300, 400 liquid crystal display device
101 first line (first repair line)
102 second line (second repair line)
103 third line (third repair line)
104 fourth line (fourth repair line)
D display region
F non-display region (bezel region)

The invention claimed is:

1. An active matrix substrate for use in a display device having a display region, and a non-display region provided outside the display region, the active matrix substrate comprising:
    a plurality of bus lines each extending in a predetermined direction, wherein the plurality of bus lines are grouped into a plurality of bus line groups including a first bus line group, and a second bus line group adjacent to the first bus line group;
    at least one first line provided in the non-display region, the at least one first line each crossing an opposite-side end portion, opposite from a signal-input-side end portion, of at least one bus line of the first bus line group with an insulating layer interposed therebetween;
    at least one second line provided in the non-display region, the at least one second line each crossing an opposite-side end portion, opposite from a signal-input-side end portion, of at least one bus line of the second bus line group with an insulating layer interposed therebetween;
    a third line provided in the non-display region, the third line crossing the signal-input-side end portion of the first bus line group with an insulating layer interposed therebetween, and not crossing the second bus line group,
    a fourth line provided in the non-display region, the fourth line crossing the signal-input-side end portion of the second bus line group with an insulating layer interposed therebetween, and not crossing the first bus line group; and
    a fifth line provided in the non-display region, the fifth line routed so as to cross the first, second, third and fourth lines with an insulating layer interposed therebetween,
    wherein the third line and the fourth line are electrically separated from each other, one end portion of the third line that is closer to the fourth line crosses the fifth line, and one end portion of the fourth line that is closer to the third line crosses the fifth line.

2. The active matrix substrate according to claim 1, wherein:
    the at least one first line is a plurality of first lines; and
    the at least one second line is a plurality of second lines.

3. The active matrix substrate according to claim 1, wherein:
    the at least one first line is one first line; and
    the at least one second line is one second line.

4. The active matrix substrate according to claim 1, wherein:
    the plurality of bus line groups further include a third bus line group, and a fourth bus line group adjacent to the third bus line group;

the active matrix substrate further comprises:
- at least one sixth line provided in the non-display region, the at least one sixth line each crossing an opposite-side end portion, opposite from a signal-input-side end portion, of at least one bus line of the third bus line group with an insulating layer interposed therebetween;
- at least one seventh line provided in the non-display region, the at least one seventh line each crossing an opposite-side end portion, opposite from a signal-input-side end portion, of at least one bus line of the fourth bus line group with an insulating layer interposed therebetween;
- an eighth line provided in the non-display region, the eighth line crossing the signal-input-side end portion of the third bus line group with an insulating layer interposed therebetween, and not crossing the fourth bus line group;
- a ninth line provided in the non-display region, the ninth line crossing the signal-input-side end portion of the fourth bus line group with an insulating layer interposed therebetween, and not crossing the third bus line group; and
- a tenth line provided in the non-display region, the tenth line routed so as to cross the sixth, seventh, eighth and ninth lines with an insulating layer interposed therebetween;

the eighth line and the ninth line are electrically separated from each other, an end portion of the eighth line that is closer to the ninth line crosses the tenth line, and an end portion of the ninth line that is closer to the eighth line crosses the tenth line; and the fifth line and the tenth line are electrically separated from each other.

5. A display device comprising the active matrix substrate according to claim 1.

6. The display device according to claim 5, wherein the plurality of bus lines are a plurality of source bus lines to which a display signal is supplied.

7. The display device according to claim 6, wherein:
- the active matrix substrate further comprises a plurality of gate bus lines each extending in a direction crossing the predetermined direction; and
- the non-display region includes a first area where signal-input-side end portions of the plurality of source bus lines are located, a second area where opposite-side end portions, opposite from a signal-input side, of the plurality of source bus lines are located, a third area where signal-input-side end portions of the plurality of gate bus lines are located, and a fourth area where opposite-side end portions, opposite from a signal-input side, of the plurality of gate bus lines are located.

8. The display device according to claim 7, wherein the fifth line is produced from the same conductive film as the plurality of gate bus lines.

9. The display device according to claim 7, wherein the fifth line is produced from the same conductive film as the plurality of source bus lines.

10. The display device according to claim 7, further comprising a first flexible printed circuit attached to an end portion of the active matrix substrate in the first area of the non-display region.

11. The display device according to claim 10, wherein the fifth line includes a portion formed on the first flexible printed circuit.

12. The display device according to claim 10, further comprising a second flexible printed circuit attached to an end portion of the active matrix substrate in the third area of the non-display region.

13. The display device according to claim 12, wherein the fifth line is routed so as not to run in the third area of the non-display region.

14. The display device according to claim 10, further comprising a gate driver that supplies a scanning signal to the plurality of gate bus lines, wherein:
- the gate driver is provided integral on the active matrix substrate in the third area of the non-display region; and
- the fifth line is routed so as to run outside the gate driver in the third area of the non-display region.

15. A method for repairing a defect of a display device for use with the display device according to claim 5, the method comprising the steps of:
- identifying one or more of the bus lines of the first bus line group and the second bus line group that has a wire break; and
- forming a wiring path that includes one of the first line and the second line, one of the third line and the fourth line, and the fifth line, and that electrically connects between a signal-input-side end portion and an opposite-side end portion, opposite from a signal-input side, of the identified bus line.

16. The method for repairing a defect of a display device according to claim 15, wherein the step of forming the wiring path includes the step of:
- electrically connecting the identified bus line with the first line, the third line and the fifth line if the identified bus line is a bus line of the first bus line group; and
- electrically connecting the identified bus line with the second line, the fourth line and the fifth line if the identified bus line is a bus line of the second bus line group.

17. A method for manufacturing a display device, comprising the steps of:
- producing a display device having the active matrix substrate; and
- repairing a display defect of the display device by using the method for repairing a defect of a display device according to claim 15.

* * * * *